United States Patent
Cok et al.

(10) Patent No.: US 9,061,463 B2
(45) Date of Patent: Jun. 23, 2015

(54) EMBOSSED MICRO-STRUCTURE WITH CURED TRANSFER MATERIAL METHOD

(71) Applicants: Ronald Steven Cok, Rochester, NY (US); Shelby Forrester Nelson, Pittsford, NY (US)

(72) Inventors: Ronald Steven Cok, Rochester, NY (US); Shelby Forrester Nelson, Pittsford, NY (US)

(73) Assignee: EASTMAN KODAK COMPANY, Rochester, NY (US)

( * ) Notice: Subject to any disclaimer, the term of this patent is extended or adjusted under 35 U.S.C. 154(b) by 176 days.

(21) Appl. No.: 13/833,244

(22) Filed: Mar. 15, 2013

(65) Prior Publication Data

US 2014/0262452 A1 Sep. 18, 2014

(51) Int. Cl.
| | |
|---|---|
| *H01S 4/00* | (2006.01) |
| *B29C 59/02* | (2006.01) |
| *H05K 1/02* | (2006.01) |
| *B29C 35/08* | (2006.01) |

(52) U.S. Cl.
CPC .......... *B29C 59/026* (2013.01); *H05K 1/0296* (2013.01); *Y10T 428/2462* (2015.01); *B29C 2035/0822* (2013.01); *B29C 2035/0827* (2013.01); *B29C 2035/0833* (2013.01); *B29C 2059/023* (2013.01)

(58) Field of Classification Search
CPC ............ H01M 8/1097; H01M 4/8885; H01M 8/1286; H01M 4/8657; H01M 8/124; H01M 4/8621; H01L 35/06
USPC ........ 29/592.1, 594–595, 830–831, 846–847, 29/825, 829; 174/251–255, 262–264; 427/557, 162, 264, 97.2; 349/117; 156/60, 273.3, 275.5; 264/227, 259, 264/446, 210.2; 425/174.4, 371
See application file for complete search history.

(56) References Cited

U.S. PATENT DOCUMENTS

| | | | |
|---|---|---|---|
| 6,624,863 B1 * | 9/2003 | Jacobs et al. ................... | 349/126 |
| 7,531,120 B2 * | 5/2009 | Van Rijn et al. ............... | 264/299 |
| 8,179,381 B2 | 5/2012 | Frey et al. | |
| 8,520,174 B2 * | 8/2013 | Huang et al. ................... | 349/117 |
| 8,770,965 B2 * | 7/2014 | Washiya et al. ................ | 425/385 |
| 2009/0218311 A1 * | 9/2009 | Jiang et al. ...................... | 216/13 |
| 2010/0026664 A1 | 2/2010 | Geaghan | |
| 2010/0328248 A1 | 12/2010 | Mozdzyn | |
| 2011/0007011 A1 | 1/2011 | Mozdzyn | |
| 2011/0099805 A1 | 5/2011 | Lee | |

FOREIGN PATENT DOCUMENTS

CN           102063951           5/2011

* cited by examiner

*Primary Examiner* — Minh Trinh
(74) *Attorney, Agent, or Firm* — Raymond L. Owens

(57) ABSTRACT

A method of making an embossed micro-structure includes providing a transfer substrate, an emboss substrate, and an embossing stamp having one or more stamp structures. Transfer material is coated on the transfer substrate. The transfer material on the transfer substrate is contacted with the stamp structures to adhere transfer material to the stamp structures. A curable emboss layer is coated on the emboss substrate. The stamp structures and adhered transfer material are contacted to the curable emboss layer on the emboss substrate to emboss a micro-structure in the curable emboss layer and transfer the transfer material to the embossed micro-structure. The curable emboss layer is cured to form a cured emboss layer having embossed micro-structures corresponding to the stamp structures and having transfer material in the embossed micro-structures. The stamp structures is removed from the cured emboss layer, substantially leaving the transfer material in the micro-structure.

22 Claims, 22 Drawing Sheets

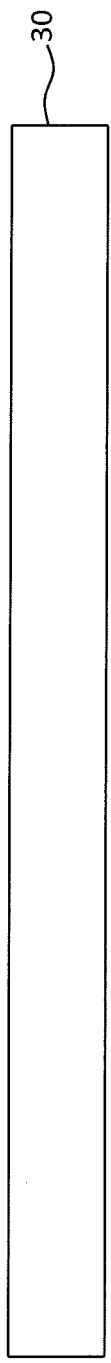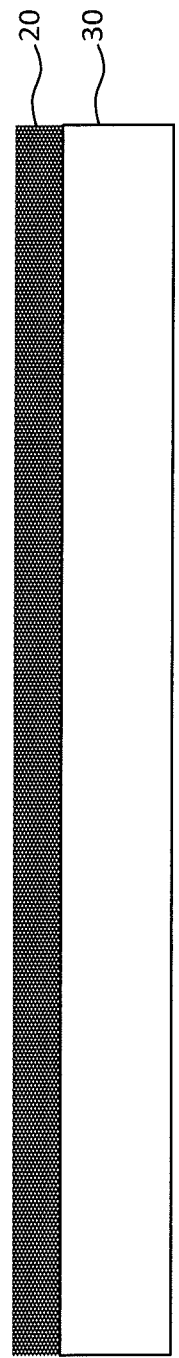
FIG. 3A
FIG. 3B

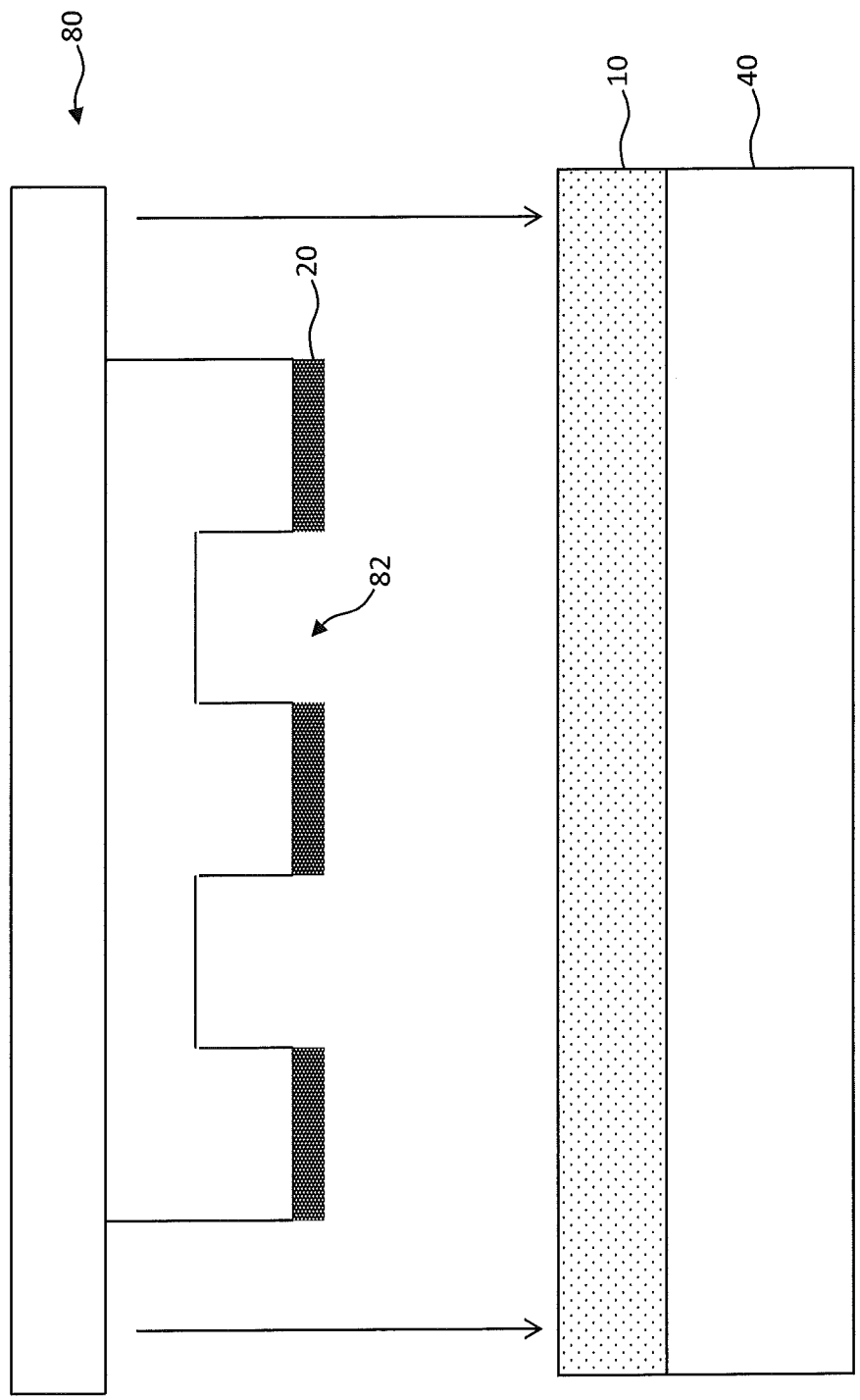

EMBOSSED MICRO-STRUCTURE WITH CURED TRANSFER MATERIAL METHOD

CROSS REFERENCE TO RELATED APPLICATIONS

Reference is made to commonly-assigned, co-pending U.S. patent application Ser. No. 13/833,361 filed Mar. 15, 2013, entitled "Embossed Micro-Structure with Cured Transfer Material" by Cok et al.

Reference is made to commonly assigned U.S. patent application Ser. No. 13/779,917, filed Feb. 28, 2013, entitled "Multi-Layer Micro-Wire Structure" by Yau et al; and commonly assigned U.S. patent application Ser. No. 13/779,939 filed Feb. 28, 2013, now U.S. Pat. No. 8,828,503 issued Sep. 9, 2014, entitled "Making Multi-Layer Micro-Wire Structure Method" by Yau et al; the disclosures of which are incorporated herein.

FIELD OF THE INVENTION

The present invention relates to transparent electrodes having micro-wires formed in light-controlling micro-channels.

BACKGROUND OF THE INVENTION

Transparent conductors are widely used in the flat-panel display industry to form electrodes that are used to electrically switch light-emitting or light-transmitting properties of a display pixel, for example in liquid crystal or organic light-emitting diode displays. Transparent conductive electrodes are also used in touch screens in conjunction with displays. In such applications, the transparency and conductivity of the transparent electrodes are important attributes. In general, it is desired that transparent conductors have a high transparency (for example, greater than 90% in the visible spectrum) and a low electrical resistivity (for example, less than 10 ohms/square).

Transparent conductive metal oxides are well known in the display and touch-screen industries and have a number of disadvantages, including limited transparency and conductivity and a tendency to crack under mechanical or environmental stress. Typical prior-art conductive electrode materials include conductive metal oxides such as indium tin oxide (ITO) or very thin layers of metal, for example silver or aluminum or metal alloys including silver or aluminum. These materials are coated, for example, by sputtering or vapor deposition, and are patterned on display or touch-screen substrates, such as glass. For example, the use of transparent conductive oxides to form arrays of touch sensors on one side of a substrate is taught in U.S. Patent Application Publication 2011/0099805 entitled "Method of Fabricating Capacitive Touch-Screen Panel".

Transparent conductive metal oxides are increasingly expensive and relatively costly to deposit and pattern. Moreover, the substrate materials are limited by the electrode material deposition process (e.g. sputtering) and the current-carrying capacity of such electrodes is limited, thereby limiting the amount of power that can be supplied to the pixel elements. Although thicker layers of metal oxides or metals increase conductivity, they also reduce the transparency of the electrodes.

Transparent electrodes including very fine patterns of conductive elements, such as metal wires or conductive traces are known. For example, U.S. Patent Publication No. 2011/0007011 teaches a capacitive touch screen with a mesh electrode, as do U.S. Patent Publication No. 2010/0026664, U.S. Patent Application Publication No. 2010/0328248, and U.S. Pat. No. 8,179,381, which are hereby incorporated in their entirety by reference. As disclosed in U.S. Pat. No. 8,179,381, fine conductor patterns are made by one of several processes, including laser-cured masking, inkjet printing, gravure printing, micro-replication, and micro-contact printing. In particular, micro-replication is used to form micro-conductors formed in micro-replicated channels. The transparent micro-wire electrodes include micro-wires between $0.5\mu$ and $4\mu$ wide and a transparency of between approximately 86% and 96%.

Conductive micro-wires can be formed in micro-channels embossed in a substrate, for example as taught in CN102063951, which is hereby incorporated by reference in its entirety. As discussed in CN102063951, a pattern of micro-channels can be formed in a substrate using an embossing technique. Embossing methods are generally known in the prior art and typically include coating a curable liquid, such as a polymer, onto a rigid substrate. A pattern of micro-channels is embossed (impressed) onto the polymer layer by a master having an inverted pattern of structures formed on its surface. The polymer is then cured. A conductive ink is coated over the substrate and into the micro-channels, the excess conductive ink between micro-channels is removed, for example by mechanical buffing, patterned chemical electrolysis, or patterned chemical corrosion. The conductive ink in the micro-channels is cured, for example by heating. In an alternative method described in CN102063951, a photosensitive layer, chemical plating, or sputtering is used to pattern conductors, for example using patterned radiation exposure or physical masks. Unwanted material (e.g. photosensitive resist) is removed, followed by electro-deposition of metallic ions in a bath.

There is a need, however, for further improvements in transparency and manufacturability for micro-wires in transparent electrodes.

SUMMARY OF THE INVENTION

In accordance with the present invention, a method of making an embossed micro-structure comprises:

providing a transfer substrate, an emboss substrate, and an embossing stamp having one or more stamp structures;

coating transfer material on the transfer substrate;

contacting the transfer material on the transfer substrate with the stamp structures to adhere transfer material to the stamp structures;

coating a curable emboss layer on the emboss substrate;

contacting the stamp structures and adhered transfer material to the curable emboss layer on the emboss substrate to emboss a micro-structure in the curable emboss layer and transfer the transfer material to the embossed micro-structure;

curing the curable emboss layer to form a cured emboss layer having embossed micro-structures corresponding to the stamp structures and having transfer material in the embossed micro-structures; and removing the stamp structures from the cured emboss layer, substantially leaving the transfer material in the micro-structure.

The present invention provides a micro-wire with improved apparent transparency and manufacturability. The micro-wires of the present invention are particularly useful in transparent electrodes for capacitive touch screen and display devices.

BRIEF DESCRIPTION OF THE DRAWINGS

The above and other features and advantages of the present invention will become more apparent when taken in conjunction with the following description and drawings wherein identical reference numerals have been used to designate identical features that are common to the figures, and wherein:

FIGS. 3A-3D are cross sections illustrating sequential steps in a method of the present invention;

FIGS. 4A-4E are cross sections illustrating sequential steps in a method of the present invention;

The Figures are not drawn to scale since the variation in size of various elements in the Figures is too great to permit depiction to scale.

DETAILED DESCRIPTION OF THE INVENTION

The present invention is directed toward electrically conductive micro-wires formed in spaced-apart micro-channel structures in a substrate. The micro-channel structures include light-controlling materials that improve the apparent transparency of the micro-channel structures, for example by providing light absorption or light diffusion in association with the micro-wires, thereby reducing the visibility of the micro-wires, and in particular reducing specular reflection from the micro-wires.

Figure 1A:
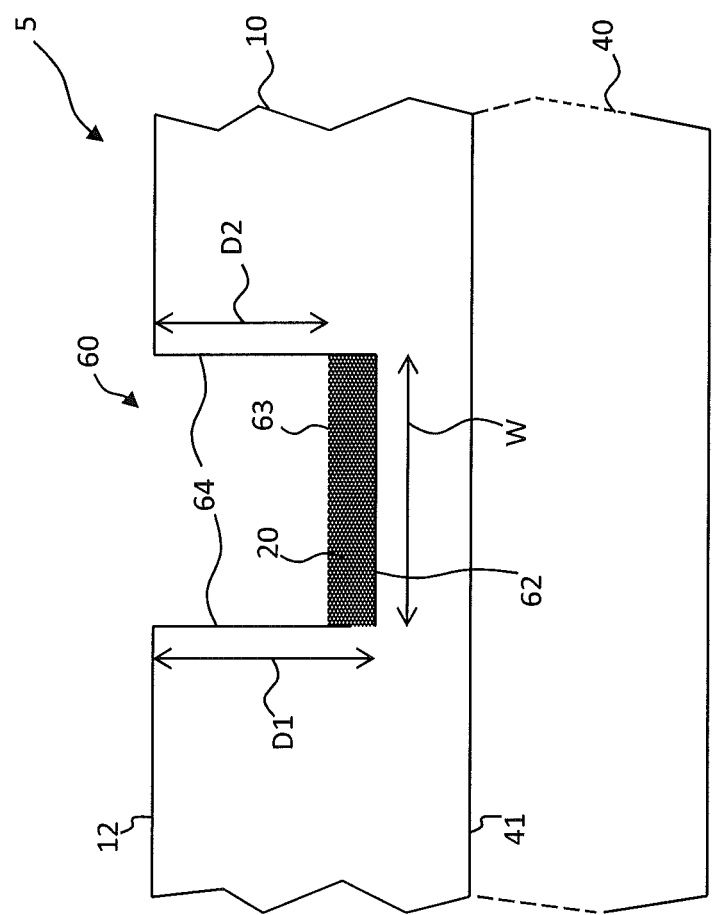
FIGS. 1A-1D are cross sections of various embossed micro-structures according to embodiments of the present invention.

Referring to FIG. 1A in an embodiment of the present invention, an embossed micro-structure 5 includes an emboss substrate 40 having a substrate surface 41. In an embodiment, embossed micro-structure 5 is a micro-channel structure, as shown. A cured emboss layer 10 is formed on substrate surface 41 of emboss substrate 40. Cured emboss layer 10 has one or more micro-channels 60 embossed therein. Micro-channel 60 extends from an emboss-layer surface 12 of cured emboss layer 10 to a micro-channel bottom 62 of micro-channel 60 and toward substrate surface 41 of emboss substrate 40. Micro-channel 60 has one or more micro-channel sides 64. A cured transfer material 20 is located on, in, or beneath the micro-channels 60, for example on or beneath micro-channel bottom 62 of micro-channel 60. Micro-channel 60 has a width W.

In one embodiment, micro-channel 60 has a depth D1 including cured transfer material 20. Alternatively, micro-channel 60 has a depth D2 that does not include cured transfer material 20. Thus, cured transfer material 20 is considered to be in micro-channel 60 or cured transfer material 20 has a transfer material surface 63 that forms micro-channel bottom 62 so that cured transfer material 20 is considered to be below micro-channel 60. Whether transfer materials 20 are considered to be in micro-channel 60, on micro-channel bottom 62 of micro-channel 60, or beneath micro-channel 60 is an arbitrary distinction depending on the definition of micro-channel 60 and a matter of nomenclature; all such embodiments are included in the present invention.

In various embodiments, depth D1 or D2 of micro-channel 60 is in the range of about two microns to ten microns, width W of micro-channel 60 is in the range of about two microns to twelve microns, and the thickness of single cured emboss layer 10 is in the range of about four microns to twelve microns.

Figure 1B:
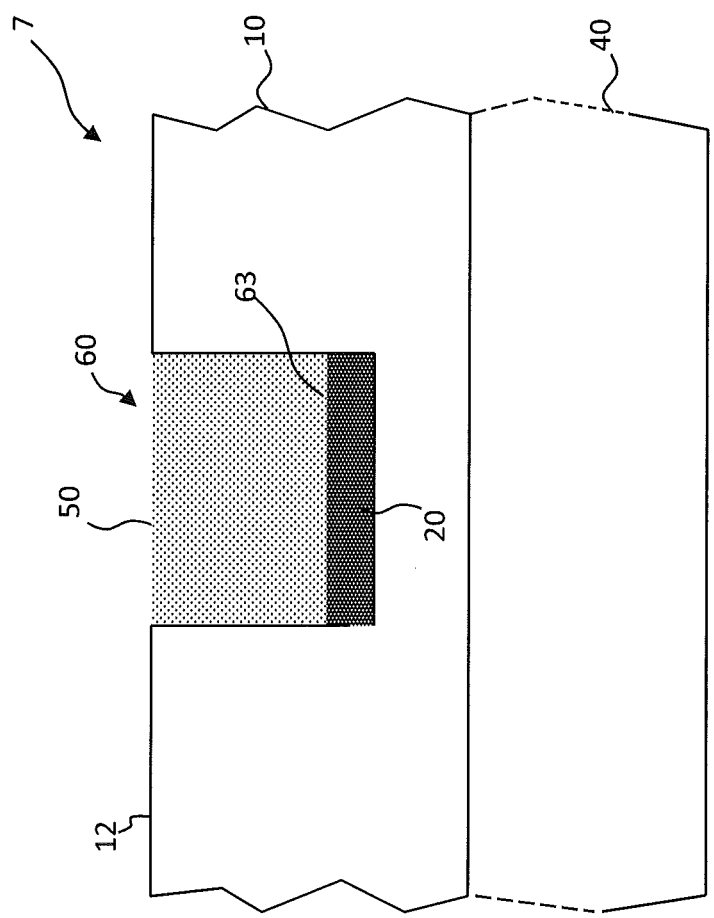

In a further embodiment of the present invention illustrated in FIG. 1B, an embossed micro-structure 7 includes micro-wires 50 formed in micro-channel 60 in cured emboss layer 10 on emboss substrate 40. Cured transfer material 20 is provided on, in, or under micro-channel 60. Micro-wires 50 of embossed micro-structure 7 can extend from cured transfer material 20 (i.e. transfer material surface 63) to emboss-layer surface 12, filling micro-channel 60. Alternatively, micro-wire 50 does not completely fill micro-channel 60.

Figure 1C:
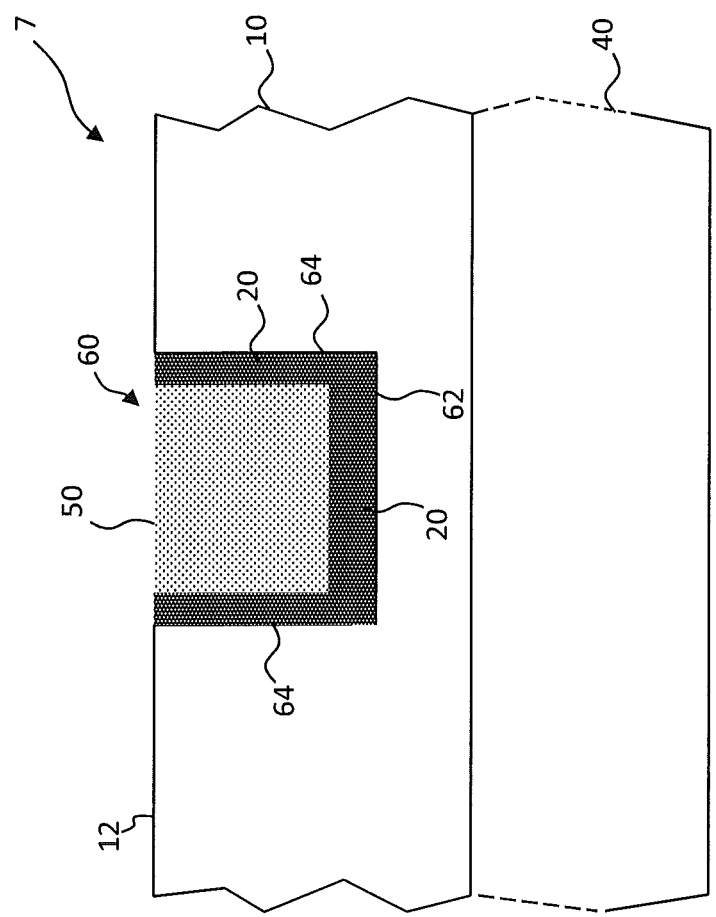

In another embodiment of the present invention illustrated in FIG. 1C, an embossed micro-structure 7 includes a cured electrical conductor forming micro-wires 50 in micro-channel 60 in cured emboss layer 10 on emboss substrate 40. Cured transfer material 20 is provided in, on, or beneath micro-channel 60 and on micro-channel sides 64 of micro-channel 60. Micro-wires 50 of embossed micro-structure 7 can extend from cured transfer material 20 at micro-channel bottom 62 of micro-channel 60 to emboss-layer surface 12. Alternatively, micro-wire 50 does not completely fill micro-channel 60. Likewise, transfer material 20 can extend to emboss-layer surface 12 on micro-channel sides 64, or not.

In an embodiment of the present invention, cured emboss layer 10 and cured transfer material 20 both include a common material, for example a curable resin, for example an ultra-violet light sensitive polymer such as SU8. In an embodiment, cured transfer material 20 includes a dye or pigment. In such an embodiment, cured transfer material 20 is light-absorbing and can be substantially black or gray.

Figure 1D:
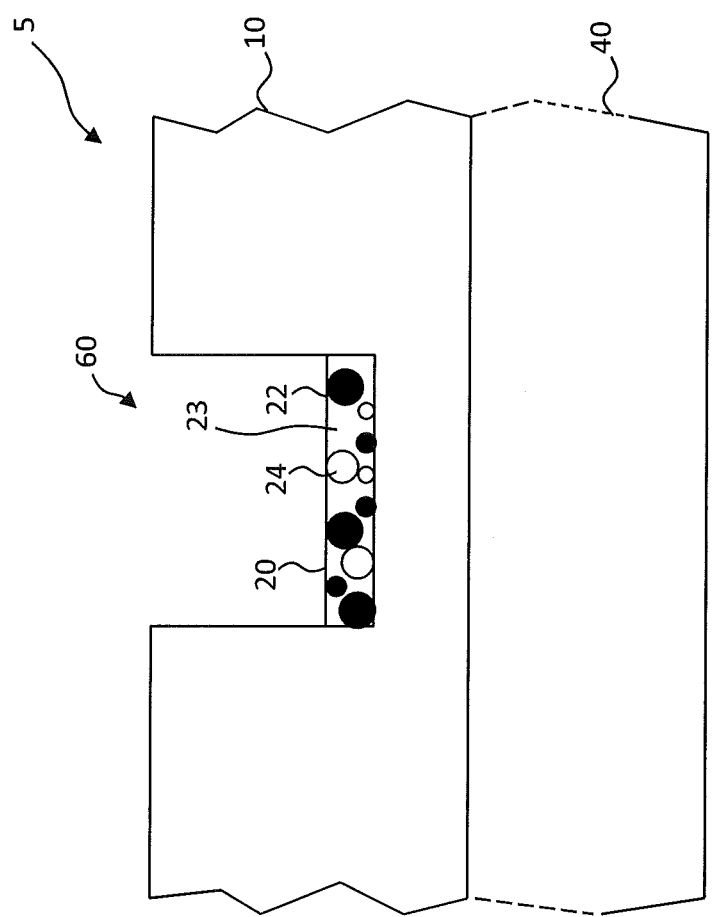

In an alternative embodiment, illustrated in FIG. 1D, cured transfer material 20 in, on, or beneath micro-channel 60 in cured emboss layer 10 on emboss substrate 40 is optically diffusive, for example having a curable binder 23 binding light-diffusing particles 22. Such light-diffusing particles 22 can be transparent, translucent, or reflective and can have an index of refraction different from that of the binder or of cured emboss layer 10, so as to diffuse incident light by reflection or refraction. Alternatively or in addition, particles 24 can absorb light, or both absorb and reflect light. By absorbing or diffusing light incident on micro-wires 50, micro-wires 50 are less visible, thereby causing a micro-wire electrode having micro-wires 50 in micro-channels 60 to be less visible to a viewer.

In yet another embodiment, cured transfer material 20 is cross linked to cured emboss layer 10. Such cross linking provides environmental robustness and binds cured transfer material 20 to cured emboss layer 10 so that they are not easily separated.

The cured electrical conductor forming micro-wires 50 can include electrically conductive nano-particles, for example silver nano-particles. The nano-particles can be sintered, welded, or agglomerated together, for example by curing with heat. In various non-limiting embodiments, the conductive nano-particles can be deposited as a liquid, for example an aqueous solution containing conductive nano-particles, as a slurry, or as a powder. If deposited in liquid form, the liquid can be dried, for example with heat. The cured electrical conductor can be porous or solid. The electrically conductive nano-particles can include metal, metal alloys, or particles with a metal or metal alloy shell. The cured electrical conductor (micro-wires 50) can be adhered to the transfer material 20 or the cured layer.

Figure 2:
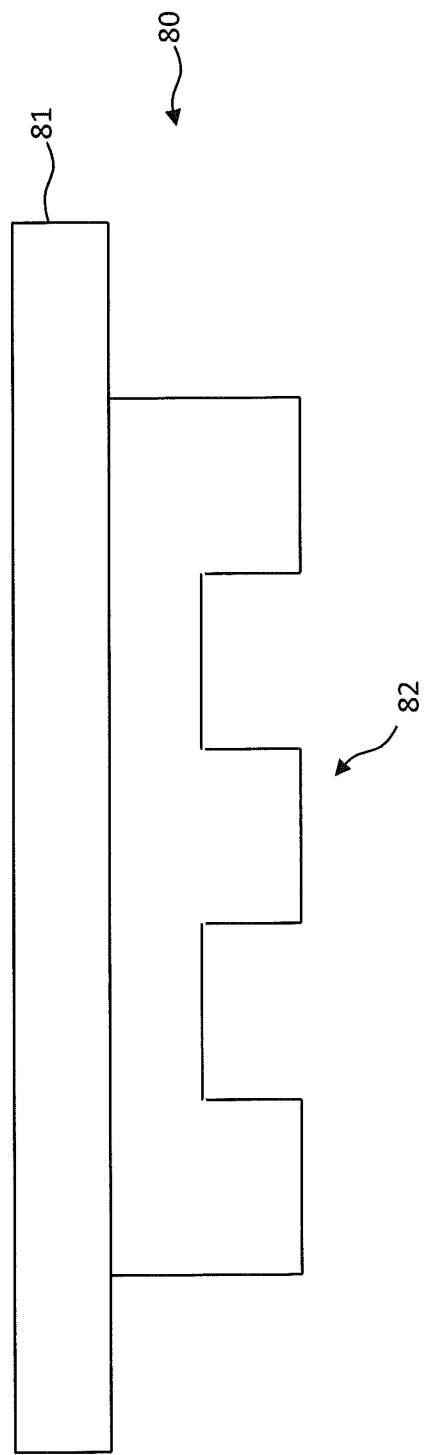
FIG. 2 is a cross section of a stamp useful for the present invention.

Referring to FIG. 2, in a method of the present invention, embossed micro-structure 5 (FIG. 1A) is made using an embossing stamp 80 formed on a stamp substrate 81 and having stamp structures 82. Embossed micro-structure 5 (FIG. 1A) has a relief pattern that is the reverse of stamp structures 82.

Figure 3C:
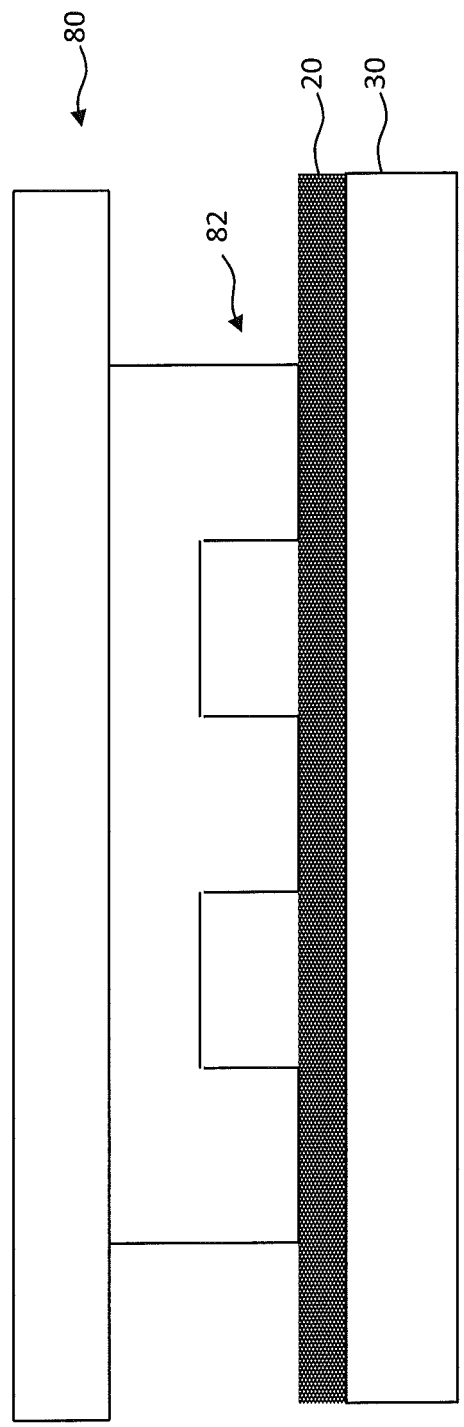
Figure 3D:
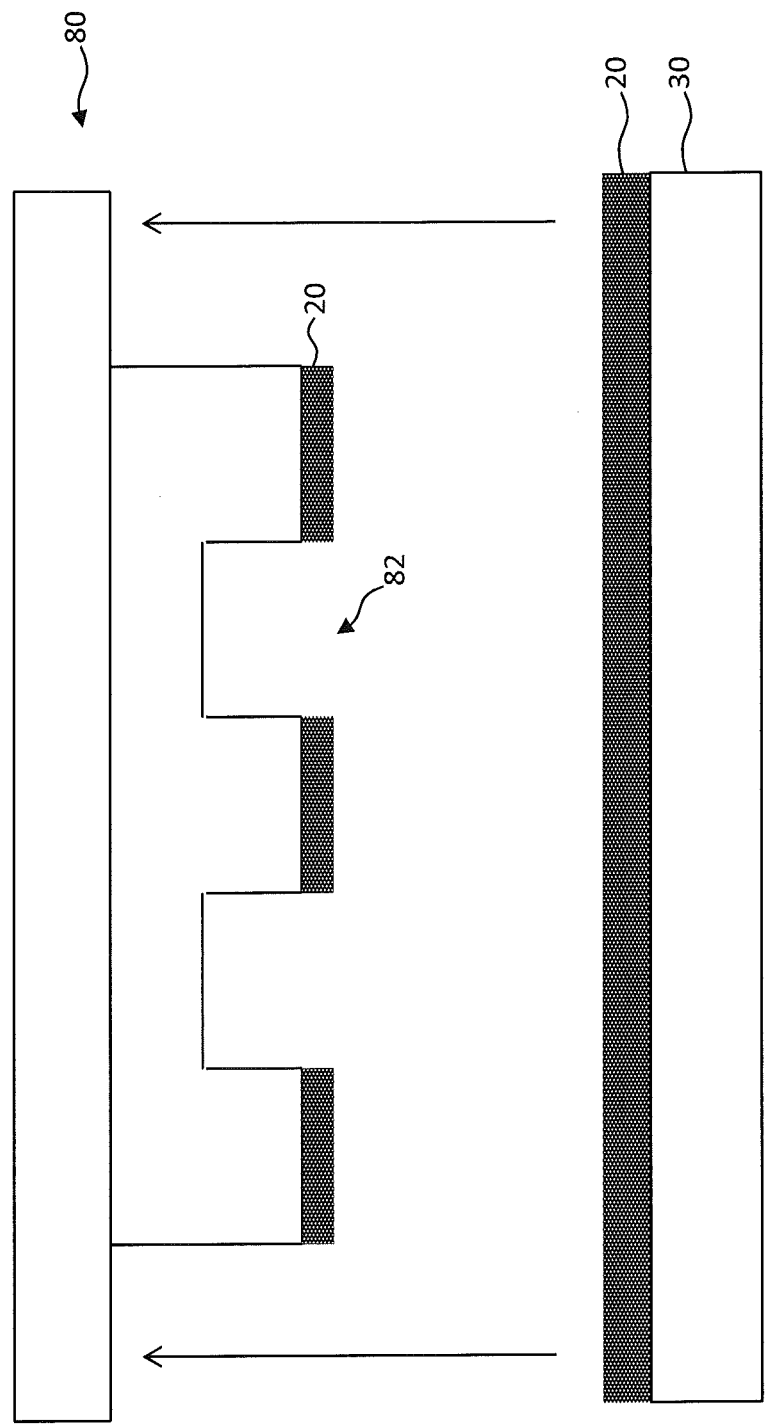
Figure 6:
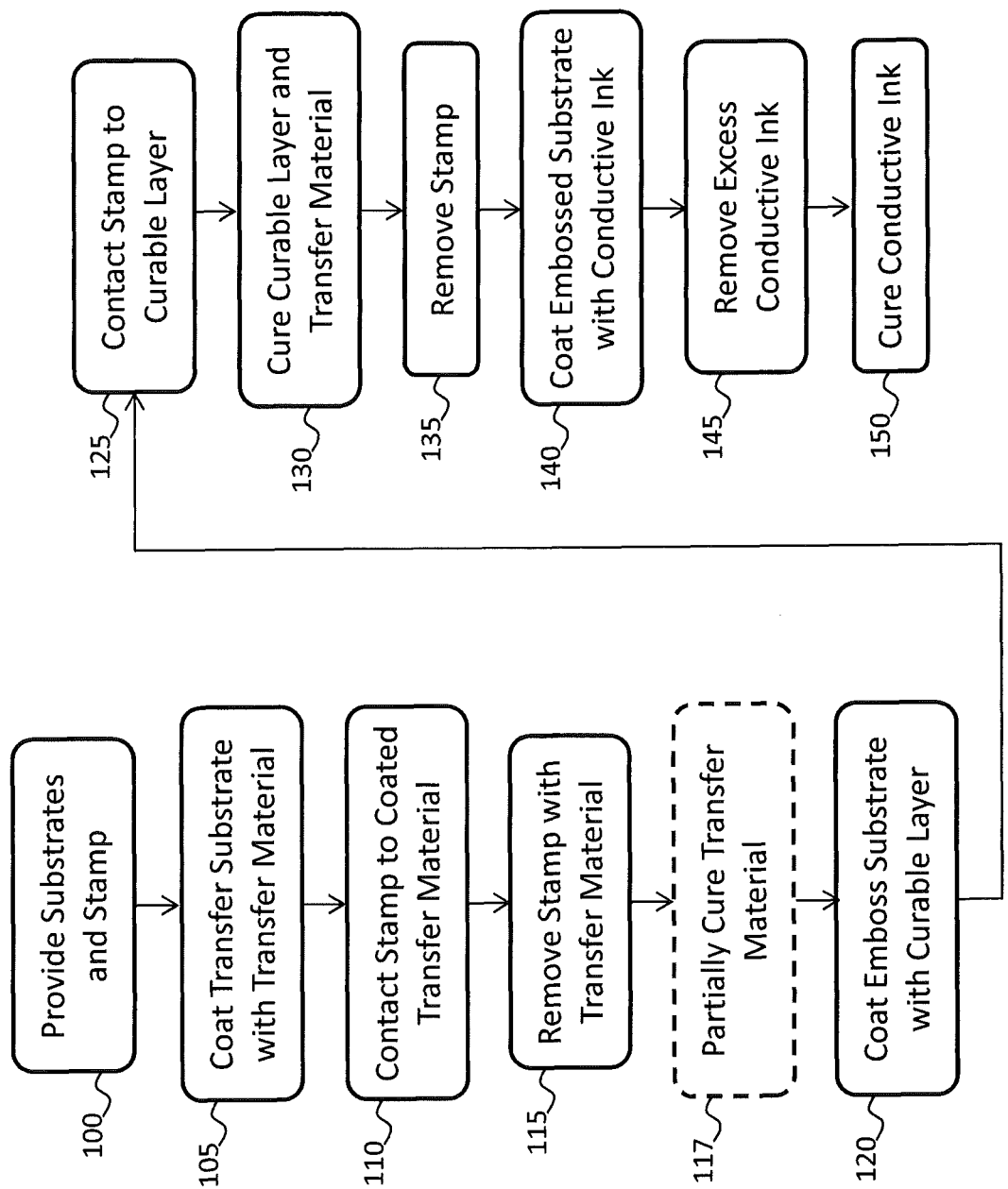
FIG. 6 is a flow diagram illustrating an embodiment of the present invention.

Referring to the cross sections of FIGS. 2, 3A-3D, and 4A-4E and to the flow diagram of FIG. 6, a method of making an embossed micro-structure 5 (FIG. 1A) includes providing 100 a transfer substrate 30 (FIG. 3A), a curable emboss substrate 40 (FIG. 4A), and embossing stamp 80 (FIG. 2) having one or more stamp structures 82 (FIG. 2). Transfer material 20 is coated 105 on transfer substrate 30 (FIG. 3B). Stamp structures 82 of embossing stamp 80 contact 110 transfer material 20 on transfer substrate 30 to adhere transfer material 20 to stamp structures 82 (FIG. 3C), for example by mechanically locating embossing stamp 80 having stamp structures 82 in contact with transfer material 20. Stamp structures 82 of embossing stamp 80 are removed 115 from transfer material 20 on transfer substrate 30 leaving transfer material 20 adhered to stamp structures 82 (FIG. 3D). Methods for mechanically moving embossing stamp 80 with respect to transfer substrate 30 are known in the art, for example with vertical or rotational motion.

Figure 4B:
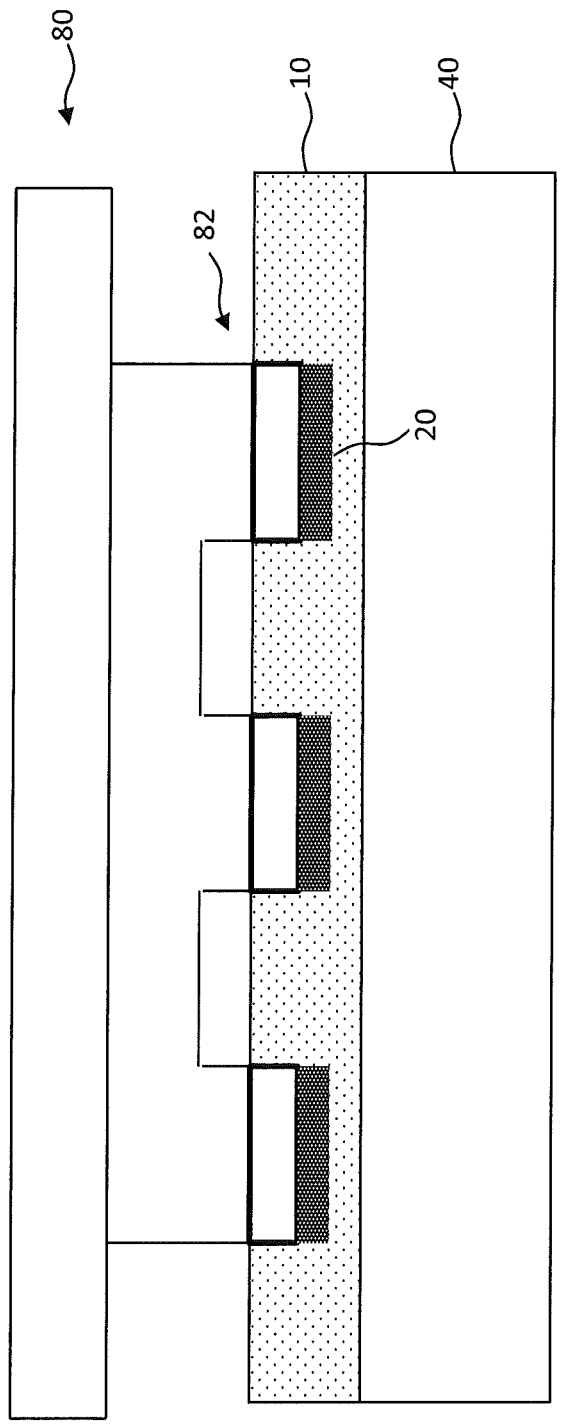

Referring to FIGS. 4A and 4B, curable emboss layer 10 is coated 120 on emboss substrate 40, for example by curtain coating, spray coating or other methods known in the art. Stamp structures 82 of embossing stamp 80 and adhered transfer material 20 are contacted 125 to curable emboss layer 10 on emboss substrate 40 to emboss micro-channel 60 in curable emboss layer 10 and transfer material 20 to embossed micro-structure 5 (not shown).

Figure 4C:
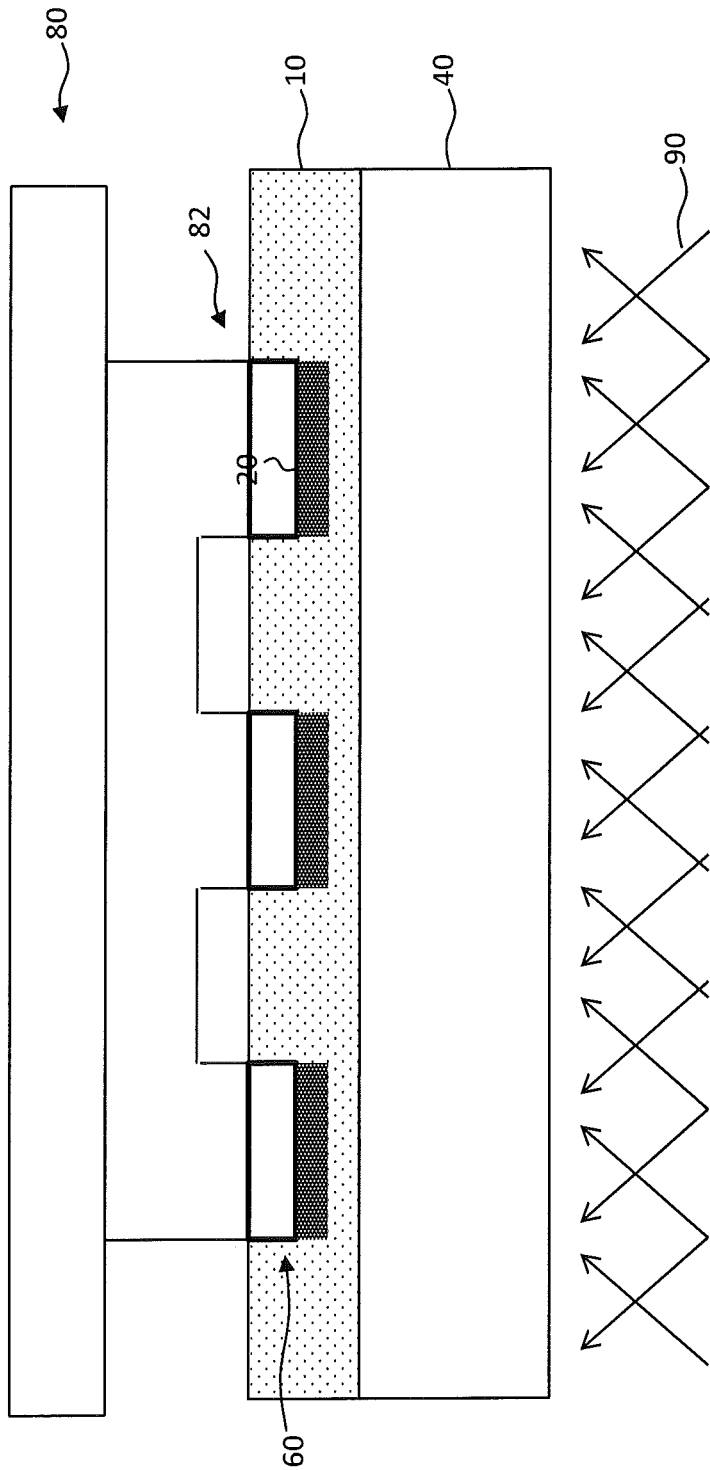
Figure 4D:
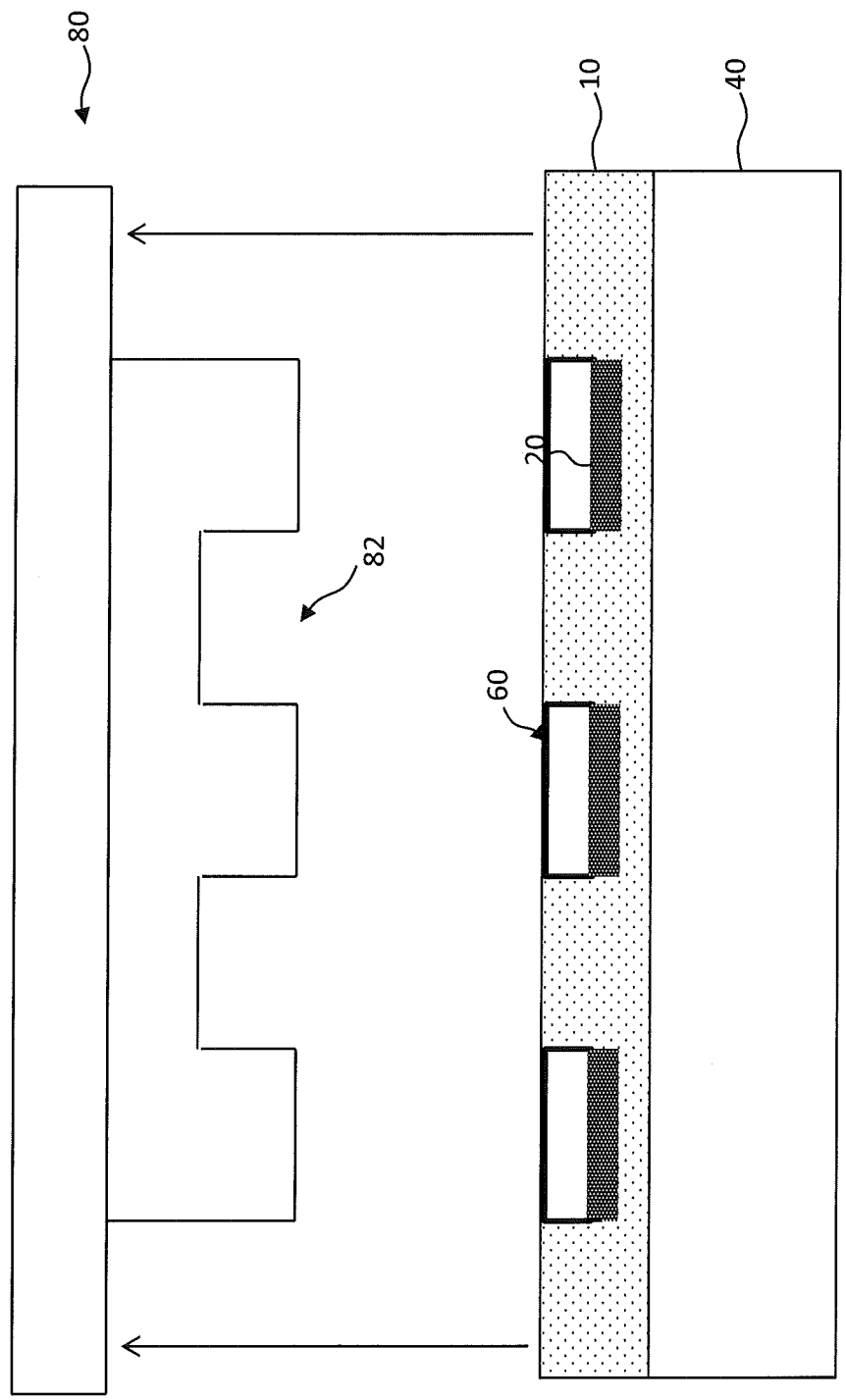
Figure 4E:
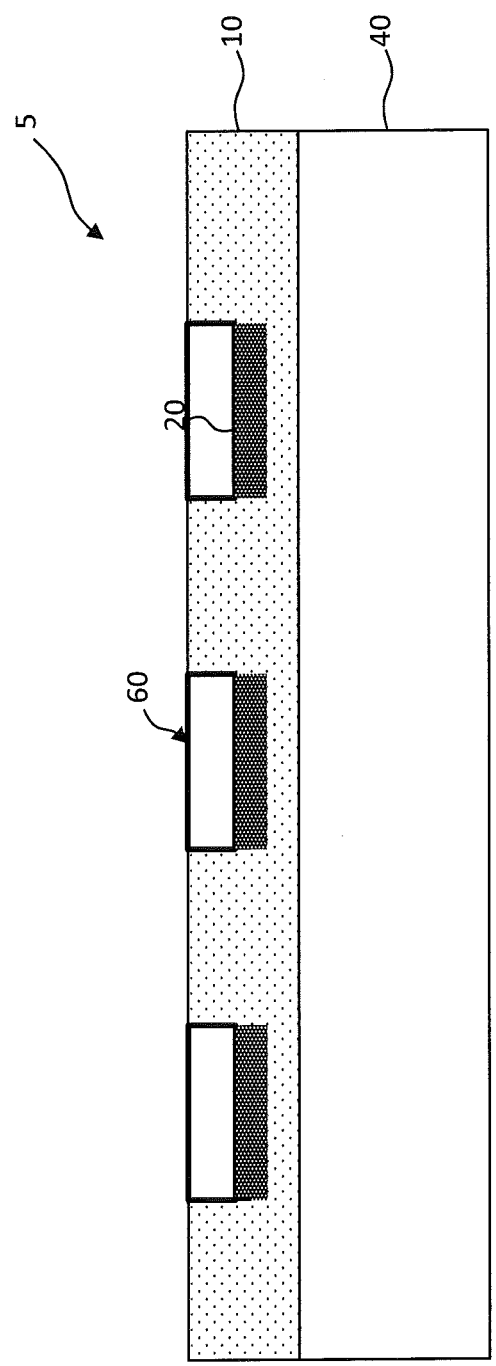

Curable emboss layer 10 is cured 130, for example with radiation 90 to form a cured emboss layer 10 having embossed micro-channels 60 corresponding to stamp structures 82 of embossing stamp 80 and having transfer material 20 in embossed micro-channel 60 (FIG. 4C). In an embodiment, transfer material 20 is curable and curable emboss layer 10 and curable transfer material 20 are cured (for example with radiation 90) at the same time and in the same step to form a cured emboss layer 10 having embossed micro-channels 60 corresponding to stamp structures 82 and having cured transfer material 20 in embossed micro-channel 60. Such curing can be done when stamp structures 82 are in contact with curable material 20. In such an embodiment, transfer material 20 can be cross linked to cured emboss layer 10, providing mechanical and environmental robustness to the embossed micro-structure 5. As noted above, micro-channel 60 can be a micro-structure. (As described herein, cured emboss layer 10 is the same layer as curable emboss layer 10 after curable emboss layer 10 is cured and is referred to with the same reference numeral 10. In an embodiment transfer material 20 is not curable; in another embodiment transfer material 20 is curable and is cured; cured and curable transfer materials 20 are both referred to with the same reference numeral 20.)

Stamp structures 82 of embossing stamp 80 are removed 135 from cured emboss layer 10 on emboss substrate 40 (FIG. 4D) substantially leaving transfer material 20 in micro-channels 60. If curable transfer materials 20 in micro-channels 60 are not yet cured, curable transfer material 20 is cured to form embossed micro-structures 5 (FIG. 4E) in cured emboss layer 10 on emboss substrate 40.

In an embodiment of the present invention in which transfer materials 20 are curable, curable transfer materials 20 are optionally at least partially cured 117 before contacting 120 embossing stamp structures 82 and adhered curable transfer material 20 to curable emboss layer 10 on emboss substrate 40.

As is shown in FIG. 4C, curable emboss layer 10 can be cured by exposing curable emboss layer 10 to radiation 90 from two or more different angles. Radiation 90 can also cure transfer material 20 if transfer material 20 is curable. Furthermore, radiation 90 can expose curable emboss layer 10 through emboss substrate 40. Alternatively, curable emboss layer 10 is exposed to radiation 90 through embossing stamp 80 (not shown). By exposing curable materials to radiation 90 from different directions, the curable materials are cured more rapidly, since any shadowing produced by light-absorbing transfer material 20 is mitigated.

Figure 5A:
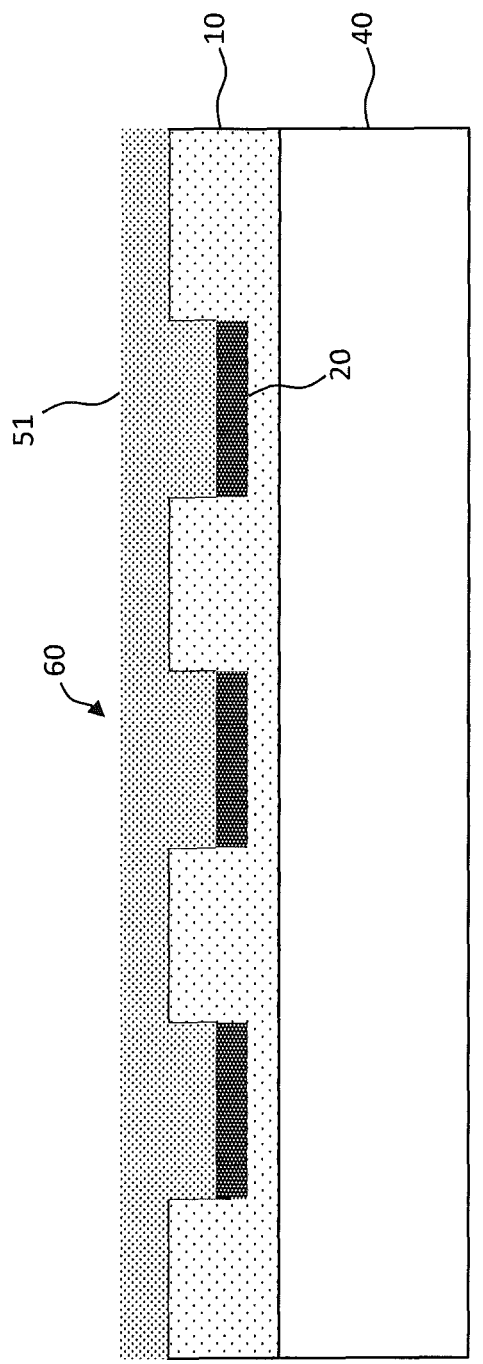
FIGS. 5A-5D are cross sections illustrating sequential steps in a method of the present invention.
Figure 5B:
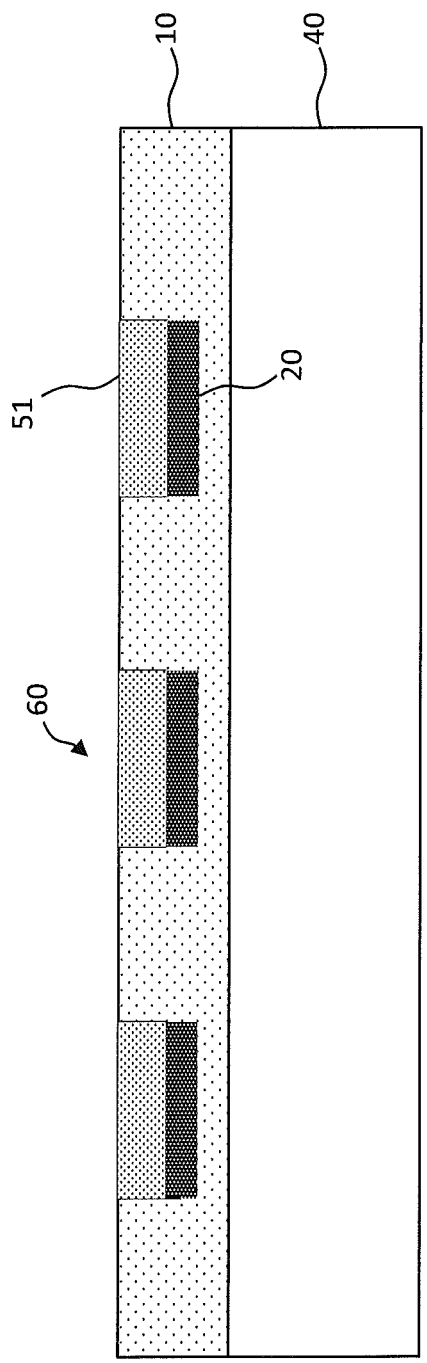
Figure 5C:
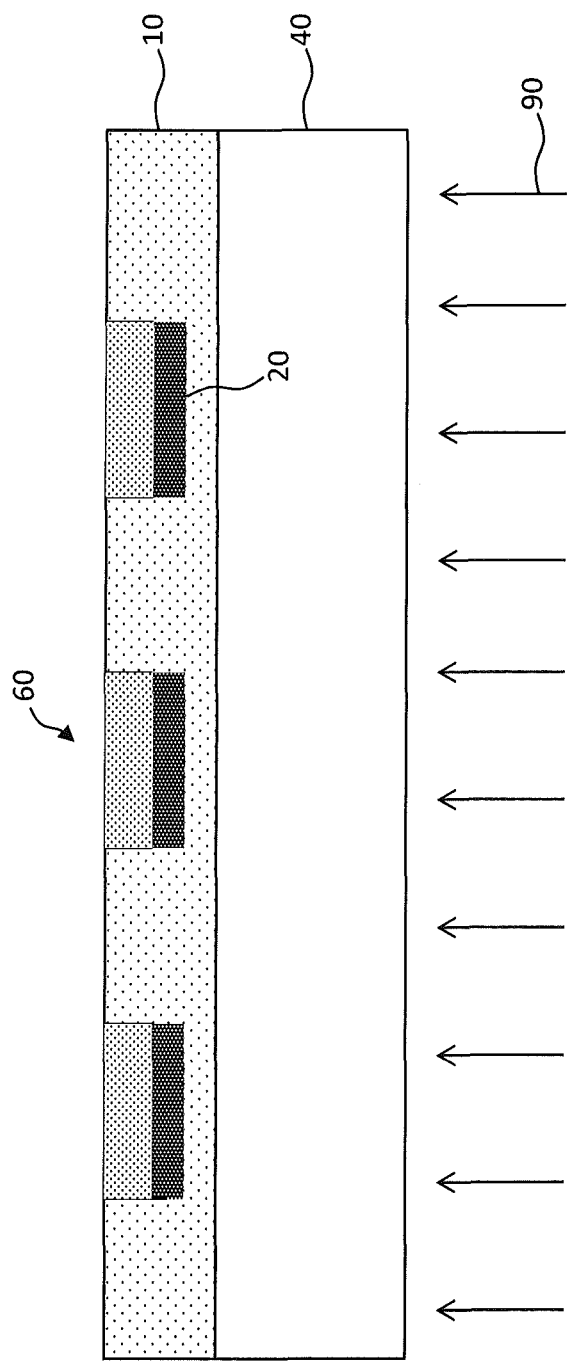
Figure 5D:
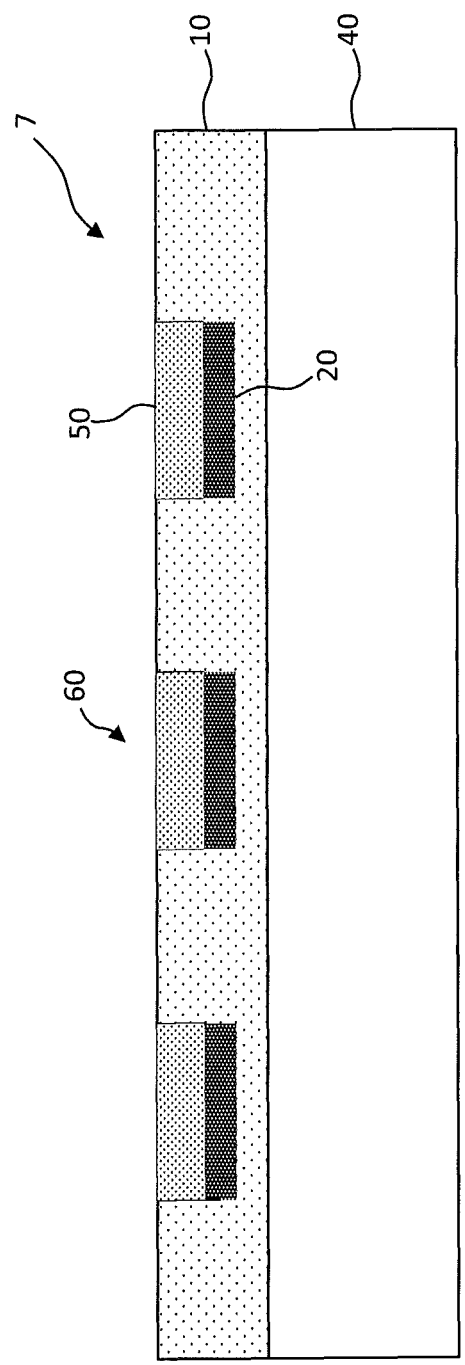

Referring to FIGS. 5A-5D, in a further embodiment of the present invention, a curable conductive ink 51 is coated 140 over emboss layer 10 and embossed micro-channels 60 having transfer material 20 on emboss substrate 40, for example by curtain, spray, or dip coating (FIG. 5A). Excess curable conductive ink 51 is removed 145 (FIG. 5B) and cured 150 (FIG. 5C), for example with radiation 90, to form micro-wires 50 in embossed micro-channels 60 in emboss layer 10 on emboss substrate 40 (FIG. 5D). Curing the electrical conductor can adhere the cured electrical conductors (micro-wires 50) to transfer material 20 or to cured embossed layer 10.

In a further embodiment, emboss layer 10 and transfer material 20 both include cross-linking agents and cured emboss layer 10 is cross linked to cured transfer material 20. Furthermore, emboss layer 10 and transfer material 20 can include a same curable material, for example a UV-sensitive curable polymer such as SU8 from MicroChem.

In further embodiments of the present invention, stamp structures 82 have a rougher surface than transfer substrate 30, stamp structures 82 have a lower surface energy than transfer substrate 30, or stamp structures 82 and transfer substrate 30 include a same material. Such attributes can preferentially adhere transfer material 20 to stamp structures 82 rather than to transfer substrate 30.

In further embodiments, transfer material 20 has a greater viscosity than the curable emboss layer 10, thereby assisting in locating transfer material at the micro-channel bottom 62 and micro-channel sides 64 of micro-channel 60.

Thus, in an embodiment of the present invention, a method of making an embossed micro-structure 5 includes providing a transfer substrate 30, an emboss substrate 40, and an embossing stamp 80 having one or more stamp structures 82; coating curable transfer material 20 on the transfer substrate 30; contacting the curable transfer material 20 on the transfer substrate 30 with the stamp structures 82 to adhere curable transfer material 20 to the stamp structures 82; coating a curable emboss layer 10 on the emboss substrate 40; contacting the stamp structures 82 and adhered curable transfer material 20 to the curable emboss layer 10 on the emboss substrate 40 to emboss a micro-channel 60 in the curable emboss layer 10 and transfer the curable transfer material 20 to the embossed micro-channel 60; curing the curable emboss layer 10 and the curable transfer material 20 in a common step to form a cured emboss layer 10 having embossed micro-channel 60 corresponding to the stamp structures 82 and having cured transfer material 20 in the embossed micro-channel 60; and removing the stamp structures 82 from the cured emboss layer 10, substantially leaving the cured transfer material 20 in the micro-channel 60.

In further embodiments, a curable conductive ink 51 is located in embossed micro-channel 60; the curable conductive ink 51 is then cured to form micro-wires 50 in embossed micro-channels 60. Alternatively, curing the electrical conductor adheres the cured electrical conductor to the transfer material 20 or to the cured emboss layer 10. Transfer material 20 can absorb light or diffuse light. In such an embodiment, emboss layer 10 is first partially cured to form micro-channels 60 with transfer material 20 and then emboss layer 10 is further cured when the curable electrical conductor is cured.

Curing any of the emboss layer 10, transfer material 20, or the curable electrical conductor can include drying, heating, or radiating them.

Figure 7A:
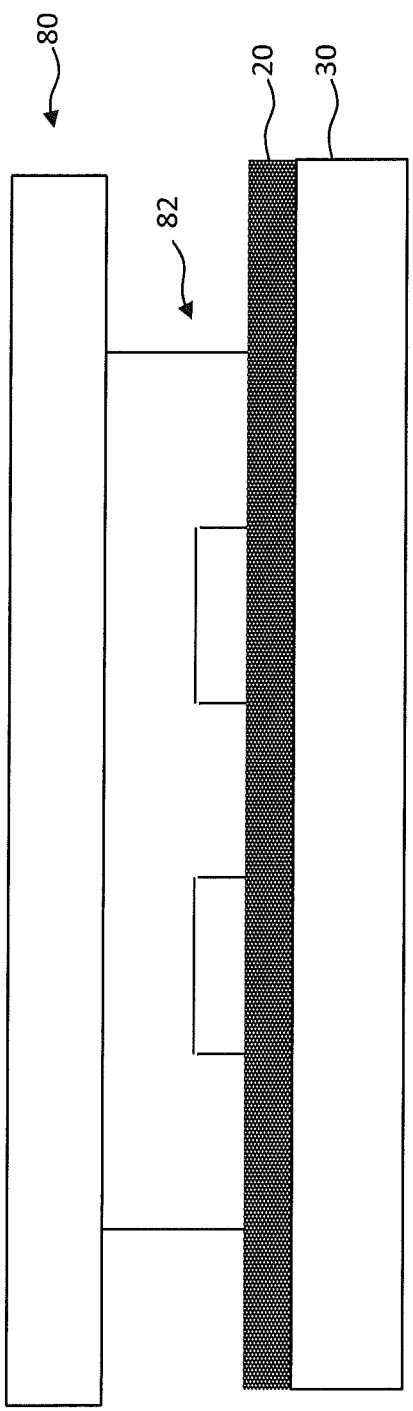
FIGS. 7A-7D are cross sections illustrating sequential steps in a method of the present invention.
Figure 7B:
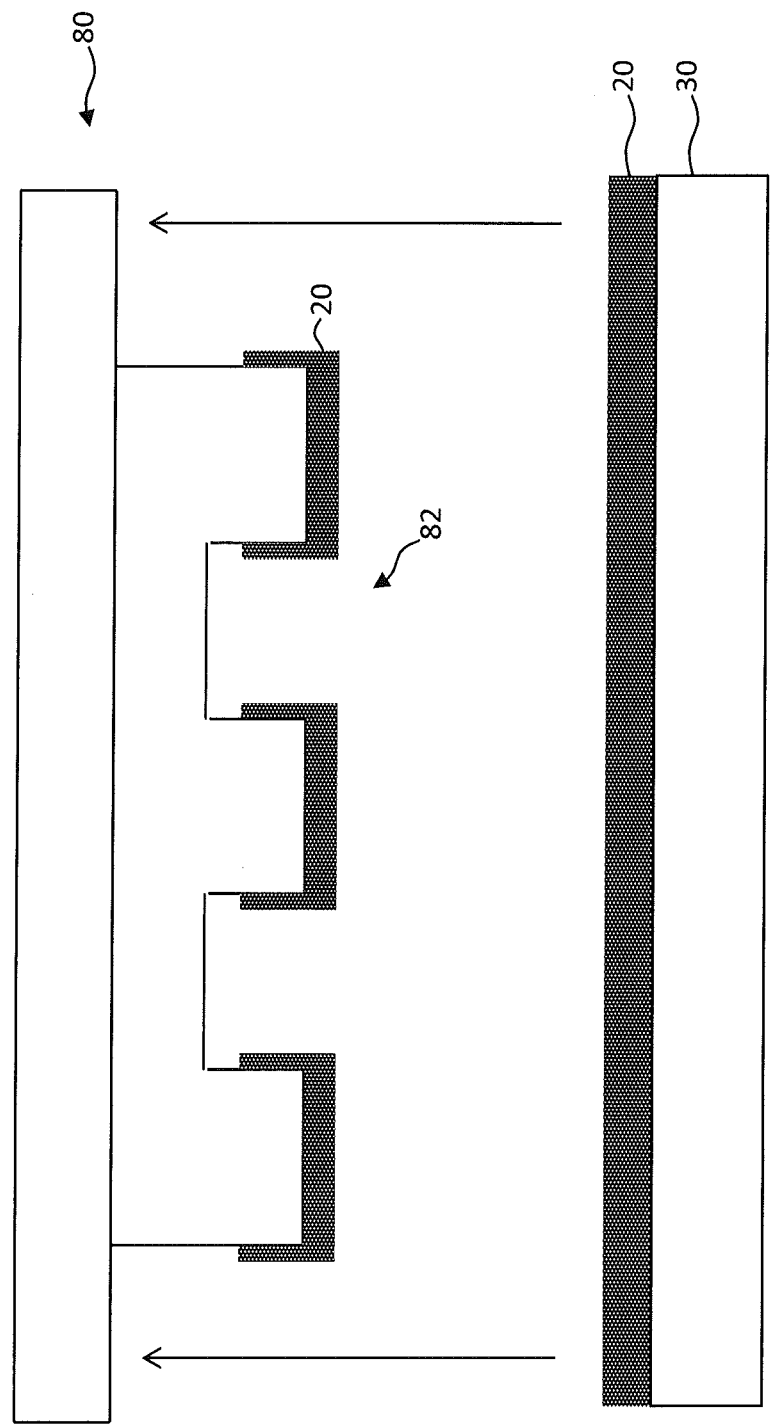
Figure 7C:
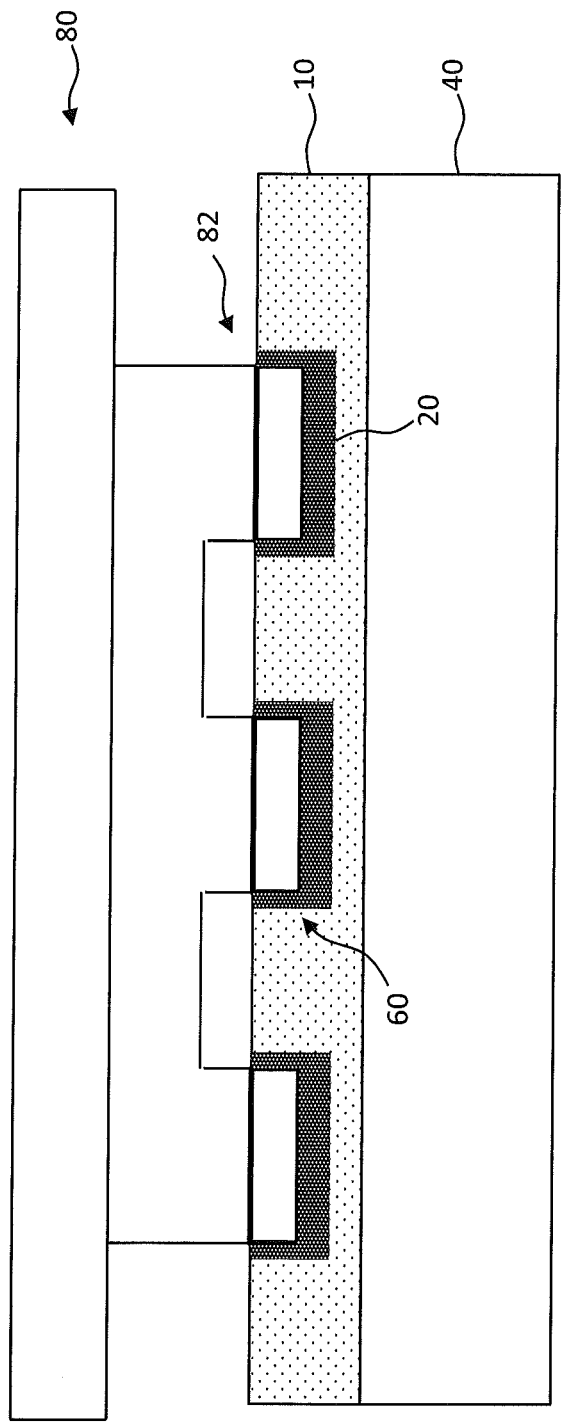
Figure 7D:
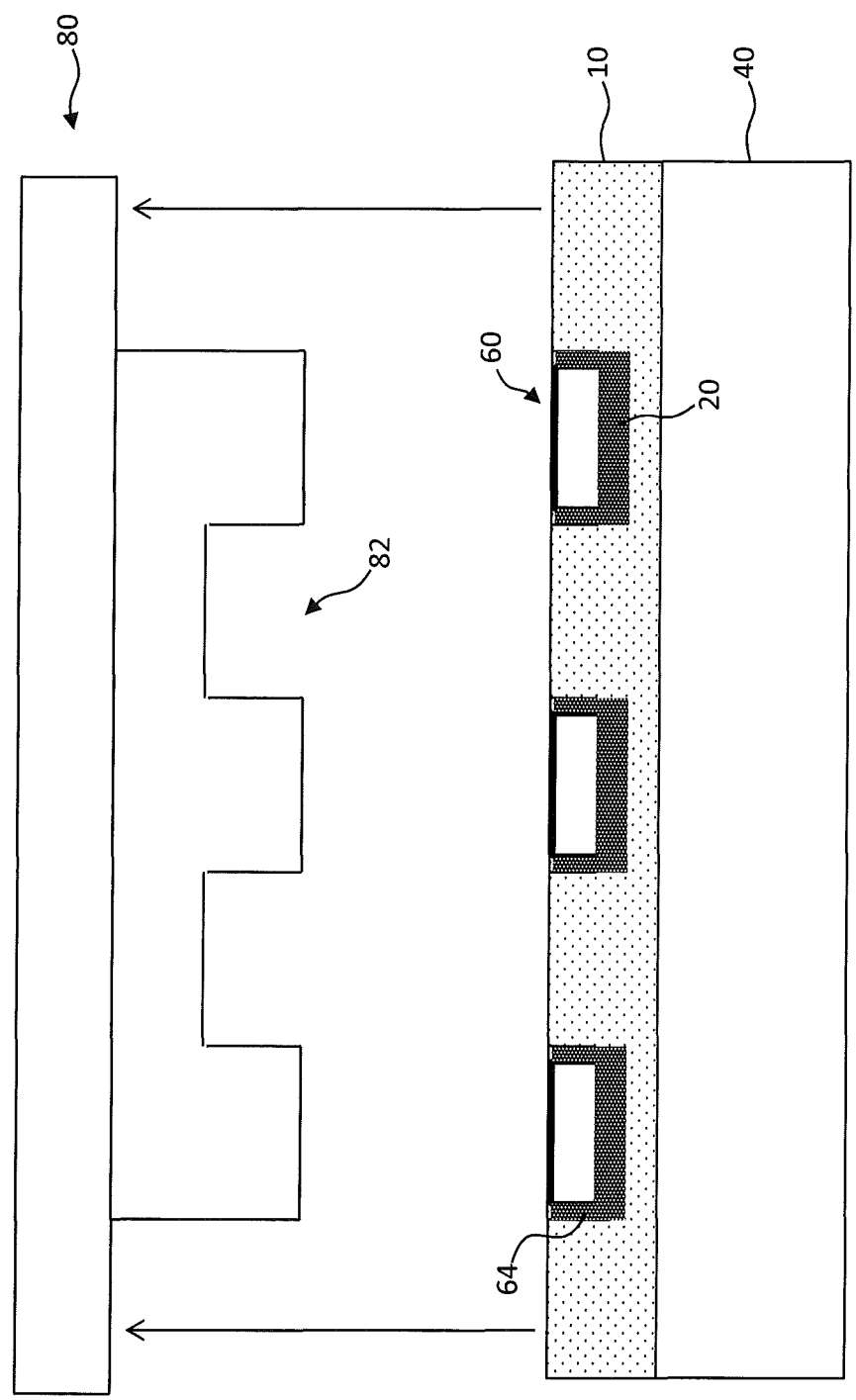

Referring further to FIGS. 7A-7D, the formation of embossed micro-structures 7 having transfer material 20 on micro-channel sides 64 (FIG. 1C) is illustrated. Referring to FIG. 7A, transfer material 20 is coated on transfer substrate 30 and contacted with stamp structures 82 of embossing stamp 80. Stamp structures 82 extend into the coated layer of transfer material 20 to adhere transfer material 20 to the bottom and sides of stamp structures 82 when embossing stamp 80 is removed from the layer of transfer material 20 coated on transfer substrate 30 (FIG. 7B).

Stamp structures 82 of embossing stamp 80 having transfer material 20 adhered to surfaces of stamp structures 82 is then contacted to curable emboss layer 10 coated on emboss substrate 40 (FIG. 7C) and cured (e.g. as shown in FIG. 4C). Embossing stamp 80 with stamp structures 82 is removed (FIG. 7D) leaving cured emboss layer 10 on emboss substrate 40 with transfer material 20 on the micro-channel sides 64 and in, on, or beneath micro-channels 60.

As used herein, a depth is also considered to be a thickness. Thus, the thickness of micro-channel 60 is also depth D1 or depth D2 (shown in FIG. 1A) of micro-channel 60.

Cured emboss layer 10 is a layer of curable material that has been cured. For example, cured emboss layer 10 is formed of a curable material coated or otherwise deposited on substrate surface 41 of emboss substrate 40 to form curable emboss layer 10 and then cured to form a cured emboss layer 10. The substrate-coated curable material is considered herein to be curable emboss layer 10 before it is cured and cured emboss layer 10 after it is cured. Similarly, the cured electrical conductor is an electrical conductor formed by locating a curable material in micro-channel 60 and curing the curable material to form cured electrical conductor in micro-channel 60. The cured electrical conductor is a micro-wire 50.

In an embodiment, cured emboss layer 10 is a layer that is embossed in a single step and cured in a single step. In an embodiment, the embossing step and the curing step are different single steps. For example, curable emboss layer 10 is embossed in a first step using a stamping method known in the art and cured in a second different step, e.g. by heat or exposure to radiation. In another embodiment, embossing and curing curable emboss layer 10 is done in a single common step. Curable emboss layer 10 can be deposited as a single layer in a single step using coating methods known in the art, e.g. curtain, spray, or dip coating. In an alternative embodiment, curable emboss layer 10 can be deposited as multiple sub-layers in a single step using multi-layer deposition methods known in the art, e.g. multi-layer slot coating, repeated curtain coatings, or multi-layer extrusion coating. In yet another embodiment, curable emboss layer 10 includes multiple sub-layers formed in different, separate steps, for example with a multi-layer extrusion, curtain coating, or slot coating machine as is known in the coating arts. Micro-channel 60 is embossed and cured in curable emboss layer 10 in a single step and micro-wires 50 are formed by depositing a curable conductive ink in micro-channels 60 and curing the curable conductive ink to form an electrically conductive micro-wire 50.

Cured emboss layer 10 useful in the present invention can include a cured polymer material with cross-linking agents that are sensitive to heat or radiation, for example infra-red, visible light, or ultra-violet radiation. The polymer material can be a curable material applied in a liquid form that hardens when the cross-linking agents are activated. When a molding device, such as an embossing stamp 80 having an inverse micro-channel stamp structure 82 is applied to liquid curable material in curable emboss layer 10 coated on emboss substrate 40 and the cross-linking agents in the curable material are activated, the liquid curable material in curable emboss layer 10 is hardened into cured emboss layer 10 having micro-channels 60. The liquid curable materials can include a surfactant to assist in controlling coating on emboss substrate 40. Materials, tools, and methods are known for embossing coated liquid curable materials to form cured emboss layers 10 having conventional single-layer micro-channels 60.

Similarly, curable inks useful in the present invention are known and can include conductive inks having electrically conductive nano-particles, such as silver nano-particles. The electrically conductive nano-particles can be metallic or have an electrically conductive shell. The electrically conductive nano-particles can be silver, can be a silver alloy, or can include silver.

Curable inks provided in a liquid form are deposited or located in micro-channels 60 and cured, for example by heating or exposure to radiation such as infra-red, visible light, or ultra-violet radiation. The curable ink hardens to form the cured ink that makes up micro-wires 50. For example, a curable conductive ink 51 with conductive nano-particles can be located within micro-channels 60 and heated to agglomerate, weld, or sinter the nano-particles, thereby forming an electrically conductive micro-wire 50. Materials, tools, and methods are known for coating liquid curable conductive inks 51, for example by dip, curtain, or spray coating to form micro-wires 50 in conventional single-layer micro-channels 60.

According to various embodiments of the present invention, emboss substrate 40 is any material having a substrate surface 41 on which a cured emboss layer 10 can be formed. Emboss substrate 40 can be a rigid or a flexible substrate made of, for example, a glass, metal, plastic, or polymer material, can be transparent, and can have opposing substantially parallel and extensive surfaces. Emboss substrates 40 can include a dielectric material useful for capacitive touch screens and can have a wide variety of thicknesses, for example 10 microns, 50 microns, 100 microns, 1 mm, or more. In various embodiments of the present invention, emboss substrates 40 are provided as a separate structure or are coated on another underlying substrate, for example by coating a polymer substrate layer on an underlying glass substrate.

Emboss substrate 40 can be an element of other devices, for example the cover or substrate of a display or a substrate, cover, or dielectric layer of a touch screen. According to embodiments of the present invention, micro-wires 50 extend across at least a portion of emboss substrate 40 in a direction parallel to substrate surface 41 of emboss substrate 40. In an embodiment, a emboss substrate 40 of the present invention is large enough for a user to directly interact therewith, for example using an implement such as a stylus or using a finger or hand. Methods are known in the art for providing suitable surfaces on which to coat a single curable layer. In a useful embodiment, emboss substrate 40 is substantially transparent, for example having a transparency of greater than 90%, 80% 70% or 50% in the visible range of electromagnetic radiation.

Electrically conductive micro-wires 50 and methods of the present invention are useful for making electrical conductors and busses for transparent micro-wire electrodes and electrical conductors in general, for example as used in electrical busses. A variety of micro-wire patterns can be used and the present invention is not limited to any one pattern. Micro-wires 50 can be spaced apart, form separate electrical conductors, or intersect to form a mesh electrical conductor on or in emboss substrate 40. Micro-channels 60 can be identical or have different sizes, aspect ratios, or shapes. Similarly, micro-wires 50 can be identical or have different sizes, aspect ratios, or shapes. Micro-wires 50 can be straight or curved.

A micro-channel 60 is a groove, trench, or channel formed on or in emboss layer 10 extending from emboss-layer surface 12 toward substrate surface 41 of emboss substrate 40 and having a cross-sectional width W less than 20 microns, for example 10 microns, 5 microns, 4 microns, 3 microns, 2 microns, 1 micron, or 0.5 microns, or less. In an embodiment, cross-sectional depth D1 or D2 of micro-channel 60 is comparable to width W. Micro-channels 60 can have a rectangular cross section, as shown. Other cross-sectional shapes, for example trapezoids, are known and are included in the present invention. The width or depth of a layer is measured in cross section.

In various embodiments, cured inks can include metal particles, for example nano-particles. The metal particles can be sintered to form a metallic electrical conductor. The metal nano-particles can be silver or a silver alloy or other metals, such as tin, tantalum, titanium, gold, copper, or aluminum, or alloys thereof. Cured inks can include light-absorbing materials such as carbon black, a dye, or a pigment.

In an embodiment, a curable ink can include conductive nano-particles in a liquid carrier (for example an aqueous solution including surfactants that reduce flocculation of metal particles, humectants, thickeners, adhesives or other active chemicals). The liquid carrier can be located in micro-channels 60 and heated or dried to remove liquid carrier or treated with hydrochloric acid, leaving a porous assemblage of conductive particles that can be agglomerated or sintered to form a porous electrical conductor in a layer. Thus, in an embodiment, curable inks are processed to change their material compositions, for example conductive particles in a liquid carrier are not electrically conductive but after processing form an assemblage that is electrically conductive.

Once deposited, the conductive inks are cured, for example by heating. The curing process drives out the liquid carrier and sinters the metal particles to form a metallic electrical conductor. Conductive inks are known in the art and are commercially available. In any of these cases, conductive inks or other conducting materials are conductive after they are cured and any needed processing completed. Deposited materials are not necessarily electrically conductive before patterning or before curing. As used herein, a conductive ink is a material that is electrically conductive after any final processing is completed and the conductive ink is not necessarily conductive at any other point in micro-wire 50 formation process.

In various embodiments of the present invention, micro-channel 60 or micro-wire 50 has a width less than or equal to 10 microns, 5 microns, 4 microns, 3 microns, 2 microns, or 1 micron. In an example and non-limiting embodiment of the present invention, each micro-wire 50 is from 10 to 15 microns wide, from 5 to 10 microns wide, or from 5 microns to one micron wide. In some embodiments, micro-wire 50 can fill micro-channel 60; in other embodiments micro-wire 50 does not fill micro-channel 60. In an embodiment, micro-wire 50 is solid; in another embodiment micro-wire 50 is porous.

Micro-wires 50 can be metal, for example silver, gold, aluminum, nickel, tungsten, titanium, tin, or copper or various metal alloys including, for example silver, gold, aluminum, nickel, tungsten, titanium, tin, or copper. Micro-wires 50 can include a thin metal layer composed of highly conductive metals such as gold, silver, copper, or aluminum. Other conductive metals or materials can be used. Alternatively, micro-wires 50 can include cured or sintered metal particles such as nickel, tungsten, silver, gold, titanium, or tin or alloys such as nickel, tungsten, silver, gold, titanium, or tin. Conductive inks can be used to form micro-wires 50 with pattern-wise deposition or pattern-wise formation followed by curing steps. Other materials or methods for forming micro-wires 50, such as curable ink powders including metallic nano-particles, can be employed and are included in the present invention.

Electrically conductive micro-wires 50 of the present invention can be operated by electrically connecting micro-wires 50 to electrical circuits that provide electrical current to micro-wires 50 and can control the electrical behavior of micro-wires 50. Electrically conductive micro-wires 50 of the present invention are useful, for example in touch screens such as projected-capacitive touch screens that use transparent micro-wire electrodes and in displays. Electrically conductive micro-wires 50 can be located in areas other than display areas, for example in the perimeter of the display area of a touch screen, where the display area is the area through which a user views a display.

Methods and devices for forming and providing substrates and coating substrates are known in the photo-lithographic arts. Likewise, tools for laying out electrodes, conductive traces, and connectors are known in the electronics industry as are methods for manufacturing such electronic system elements. Hardware controllers for controlling touch screens and displays and software for managing display and touch screen systems are well known. All of these tools and methods can be usefully employed to design, implement, construct, and operate the present invention. Methods, tools, and devices for operating capacitive touch screens can be used with the present invention.

The present invention is useful in a wide variety of electronic devices. Such devices can include, for example, photovoltaic devices, OLED displays and lighting, LCD displays, plasma displays, inorganic LED displays and lighting, electrophoretic displays, electrowetting displays, dimming mirrors, smart windows, transparent radio antennae, transparent heaters and other touch screen devices such as resistive touch screen devices.

The invention has been described in detail with particular reference to certain embodiments thereof, but it will be understood that variations and modifications can be effected within the spirit and scope of the invention.

PARTS LIST

D1 depth
D2 depth
W width
5 embossed micro-structure
7 embossed micro-structure
10 emboss layer
12 emboss-layer surface
20 transfer material
22 light-diffusing particles
23 curable binder
24 particles
30 transfer substrate
40 emboss substrate
41 substrate surface 50 micro-wire
51 curable conductive ink
60 micro-channel
62 micro-channel bottom
63 transfer material surface
64 micro-channel sides
80 embossing stamp
81 stamp substrate
82 stamp structures
90 radiation
100 provide emboss substrate, transfer substrate, and embossing stamp step
105 coat transfer substrate with transfer material step
110 contact stamp to coated transfer material step
115 remove stamp with transfer material step
117 optional partially cure transfer material step
120 coat emboss substrate with curable material step
125 contact stamp to curable layer step
130 cure curable layer and transfer material step
135 remove stamp step
140 coat emboss substrate with conductive ink step
145 remove excess conductive ink step
150 cure conductive ink step

The invention claimed is:

1. A method of making an embossed micro-structure, comprising:
providing a transfer substrate, an emboss substrate, and an embossing stamp having one or more stamp structures;
coating transfer material on the transfer substrate;
contacting the transfer material on the transfer substrate with the stamp structures to adhere transfer material to the stamp structures;
coating a curable emboss layer on the emboss substrate;
contacting the stamp structures and adhered transfer material to the curable emboss layer on the emboss substrate to emboss a micro-structure in the curable emboss layer and transfer the transfer material to the embossed micro-structure;
curing the curable emboss layer to form a cured emboss layer having embossed micro-structures corresponding to the stamp structures and having transfer material in the embossed micro-structures; and
removing the stamp structures from the cured emboss layer, substantially leaving the transfer material in the micro-structure.

2. The method of claim 1, wherein the curable material is cured to form the cured emboss layer and embossed microstructures when the stamp structures are in contact with the curable material.

3. The method of claim 1, further including removing the stamp structures from contact with the curable transfer material and then curing the curable transfer material to form the embossed micro-structures.

4. The method of claim 1, wherein the transfer materials are curable and further including at least partially curing the transfer materials before contacting the embossing stamp structures and adhered transfer material to the curable emboss layer on the emboss substrate.

5. The method of claim 1, wherein the transfer materials are curable and wherein curing the curable emboss layer also cures the transferred transfer material in a single step.

6. The method of claim 5, wherein the curable emboss layer and transfer material both include cross-linking agents and the cured emboss layer is cross linked to the cured transfer material.

7. The method of claim 1, wherein the curable emboss layer and the transfer material include a same curable material.

8. The method of claim 1, wherein the transfer material includes a light-absorbing dye or pigment or includes light-diffusive elements.

9. The method of claim 1, wherein the stamp structures have a rougher surface than the transfer substrate.

10. The method of claim 1, wherein the stamp structures have a lower surface energy than the transfer substrate.

11. The method of claim 1, wherein the stamp structures and the transfer substrate include the same material.

12. The method of claim 1, wherein the embossed microstructures are micro-channels, each embossed micro-channel has one or more sides and a bottom, and wherein the transfer materials are located on both the bottom and one or more of the sides.

13. The method of claim 1, wherein the curable emboss layer is cured by exposing the curable emboss layer to radiation from two or more different angles.

14. The method of claim 1, wherein the transfer material has a greater viscosity than the curable emboss layer.

15. The method of claim 1, further including locating a curable conductive ink in the embossed micro-structures.

16. The method of claim 15, further including curing the curable conductive ink to form micro-wires in the embossed micro-structures.

17. The method of claim 16, wherein curing the electrical conductor adheres the cured electrical conductor to the transfer material or the cured emboss layer.

18. A method of making an embossed micro-structure, comprising:
providing a transfer substrate, an emboss substrate, and an embossing stamp having one or more stamp structures;
coating curable transfer material on the transfer substrate;
contacting the curable transfer material on the transfer substrate with the stamp structures to adhere curable transfer material to the stamp structures;
coating a curable emboss layer on the emboss substrate;
contacting the stamp structures and adhered curable transfer material to the curable emboss layer on the emboss substrate to emboss a micro-structure in the curable emboss layer and transfer the curable transfer material to the embossed micro-structure;
curing the curable emboss layer and the curable transfer material in a common step to form a cured emboss layer having embossed micro-structures corresponding to the stamp structures and having cured transfer material in the embossed micro-structures; and
removing the stamp structures from the cured emboss layer, substantially leaving the cured transfer material in the micro-structure.

19. The method of claim 18, further including locating a curable conductive ink in the embossed micro-structures.

20. The method of claim 19, further including curing the curable conductive ink to form micro-wires in the embossed micro-structures.

21. The method of claim 20, wherein curing the electrical conductor adheres the cured electrical conductor to the transfer material or the cured emboss layer.

22. The method of claim 18, wherein the transfer material absorbs light or diffuses light.

* * * * *